(12) United States Patent
Yasutomi et al.

(10) Patent No.: US 7,565,002 B2
(45) Date of Patent: Jul. 21, 2009

(54) WAFER SURFACE OBSERVATION APPARATUS

(75) Inventors: Hiroyuki Yasutomi, Mitaka (JP); Mikio Sakuma, Mitaka (JP); Hirofumi Shimoda, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 565 days.

(21) Appl. No.: 10/493,865

(22) PCT Filed: Nov. 6, 2001

(86) PCT No.: PCT/JP01/09679

§ 371 (c)(1),
(2), (4) Date: Dec. 20, 2004

(87) PCT Pub. No.: WO03/041159

PCT Pub. Date: May 15, 2003

(65) Prior Publication Data

US 2005/0105790 A1 May 19, 2005

(51) Int. Cl.
*G06K 9/00* (2006.01)
(52) U.S. Cl. .................. 382/151; 382/145; 382/152
(58) Field of Classification Search .............. 382/151
See application file for complete search history.

(56) References Cited

U.S. PATENT DOCUMENTS 5,050,111 A * 9/1991 Ayata et al. ............... 700/302
6,363,168 B1 * 3/2002 Kakuma .................... 382/151
6,504,948 B1 * 1/2003 Schemmel et al. ......... 382/149

FOREIGN PATENT DOCUMENTS

| JP | 06-331945 | 12/1994 |
| JP | 7-321181 A | 12/1995 |
| JP | 08-338705 | 12/1996 |
| JP | 09-197287 | 7/1997 |
| JP | 9-309036 A | 12/1997 |
| JP | 10-27839 | 1/1998 |
| JP | 11-135601 | 5/1999 |
| JP | 2000-171722 | 6/2000 |

OTHER PUBLICATIONS

Japanese Office Action dated Sep. 9, 2004 and translation.

* cited by examiner

*Primary Examiner*—Vikkram Bali
*Assistant Examiner*—Edward Park
(74) *Attorney, Agent, or Firm*—Harness, Dickey & Pierce, P.L.C.

(57) ABSTRACT

A dicing apparatus for moving a wafer quickly to a desired observation position before the wafer surface is observed. The apparatus comprises imaging means for imaging the surface of a wafer, display means for displaying the image picked up by the imaging means, input means for inputting position information by designating an arbitrary position displayed by the display means, by using the display position on the display means, conversion means for converting the inputted position information into positional information on the position of the wafer surface, and moving means for moving the display position on the basis of the converted positional information. The apparatus displays the image in the displayed position moved.

4 Claims, 7 Drawing Sheets

WAFER SURFACE OBSERVATION APPARATUS

TECHNICAL FIELD

The present invention relates to a wafer observation position designating apparatus and a wafer display position designating method and particularly relates to a wafer observation position designating apparatus and a wafer display position designating method whereby a surface of a wafer is picked up image by a microcamera and the like, the image of the wafer surface is displayed, and a pattern on the wafer surface is observed.

BACKGROUND ART

Conventionally wafer surface observation apparatuses are known whereby a work placed on a mounting table is enlarged and picked up image by a microcamera and the like to set a processing standard and observe processing results. A display range on a wafer which is enlarged and displayed by the conventional wafer surface observation apparatus is limited to just a part of an area on the wafer. Thus, when an observation position is changed, the operator operates an axis drive button or a joystick so that each axis is driven and the position of the camera relative to the wafer is moved. Thus, the imaging range of the camera is moved to a desired position.

However, in the wafer surface observation apparatus which moves an observation position on a surface of a wafer by using the conventional axis drive button or joystick as input means, since the input means is means for inputting a rate vector, there is a problem that it is difficult to position the observation position swiftly on a fine pattern formed on the wafer surface.

The present invention is devised in view of such circumstances and has as its object the provision of a wafer observation designating apparatus and a wafer display position designating method whereby a microcamera can be swiftly moved to a desired observation position with ease.

DISCLOSURE OF THE INVENTION

In order to attain the above object, a wafer observation position designating apparatus according to the present invention is a wafer observation position designating apparatus for observing a pattern on a surface of a wafer, comprising image pickup means for picking up image of the surface of the wafer, display means for displaying an image picked up by the image pickup means, input means for inputting position information by designating an arbitrary position displayed by the display means, by using a position on the display, conversion means for converting the inputted position information into position information about the wafer surface, and moving means for moving a display position according to the converted position information about the wafer surface, wherein the display means displays the image of the display position after the movement.

According to the wafer observation position designating apparatus of the present invention, when a surface of a wafer is observed, quick movement is able to be made to a desired display position.

BEST MODE FOR CARRYING OUT THE INVENTION

The following will describe a preferred embodiment of a wafer observation position designating apparatus and a wafer display position designating method of the present invention in accordance with the accompanying drawings.

Figure 1:
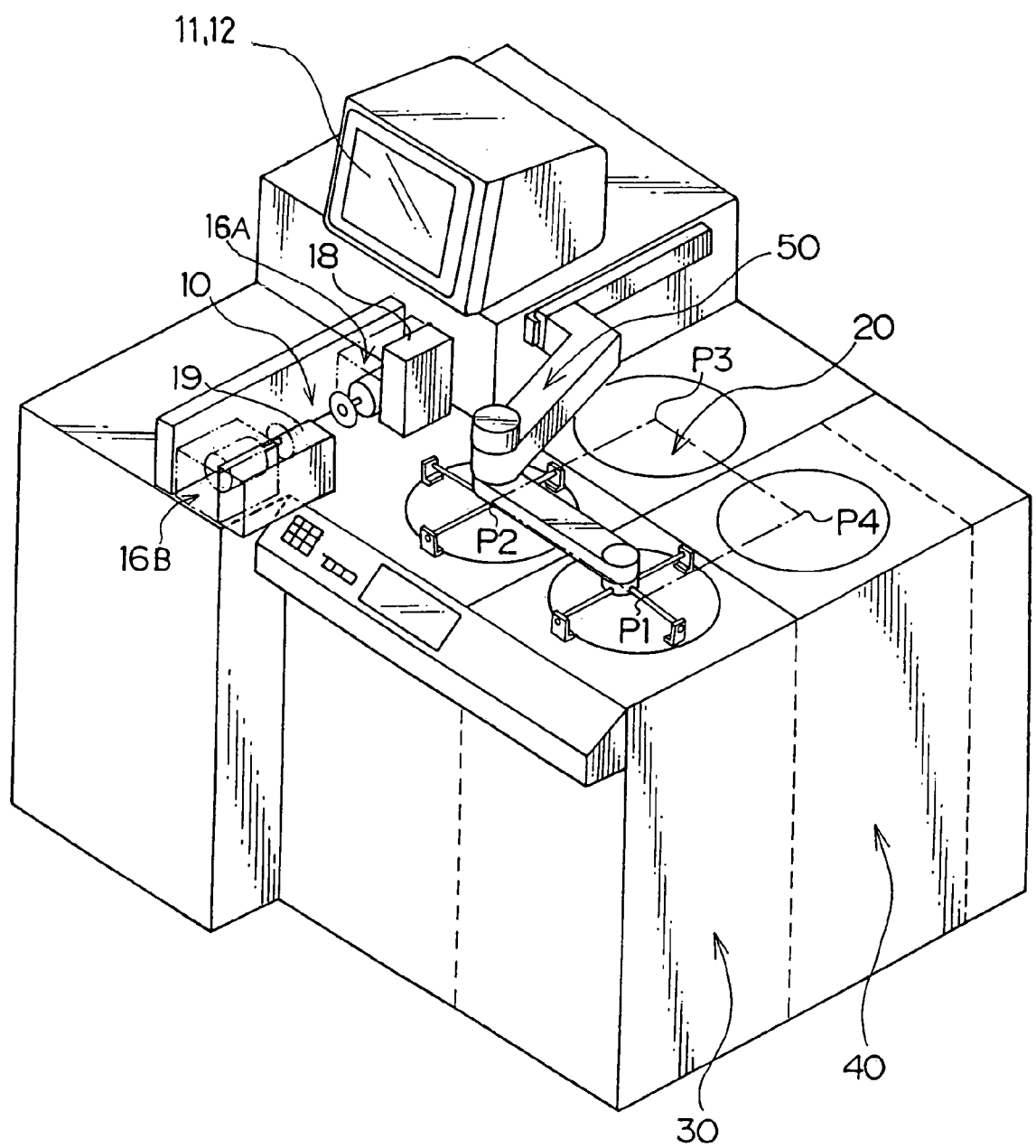
FIG. 1 is a perspective view showing a dicing device according to the present invention.
Figure 2:
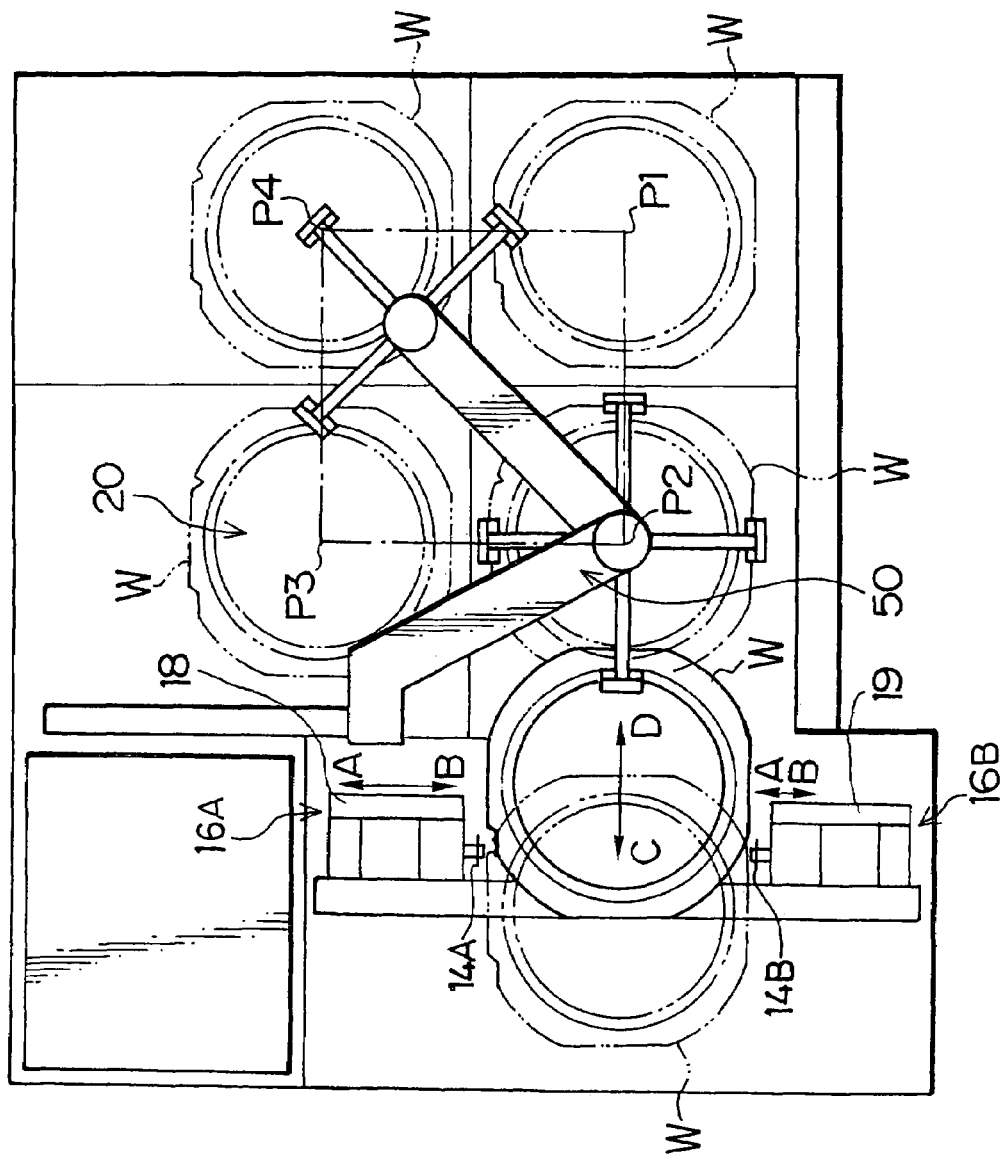
FIG. 2 is a plan view showing the dicing device according to the present invention.

FIG. 1 is a perspective view showing a dicing device according to the wafer observation position designating apparatus and the wafer display position designating method of the present invention. FIG. 2 is a plan view showing the dicing device.

The dicing device is constituted of a cutting section 10 for observing a surface of a wafer (work) W and cutting the wafer W in crossing directions to finally have a lattice pattern, a cleaning section 20 for cleaning the cut wafer W, a cassette 30 for storing processed and unprocessed wafers W, an elevator 40 for drawing the unprocessed wafer W from a desired position of the cassette 30, prealigning the wafer W on a stage, and storing the processed wafer W, which has been set on the stage, on a desired position of the cassette 30, and a carrying device 50 for carrying the wafer in the above steps.

As shown in FIG. 2, as carrying positions for the wafer W carried by the carrying device 50, four positions P1, P2, P3, and P4 are available. The positions P1 to P4 are arranged on the four corners of a square. Additionally, the position P1 is a position where the wafer W is preloaded, the position P2 is a position where the wafer W is loaded/unloaded on a cutting table for carrying the wafer W to the cutting section 10, the position P3 is a position where the wafer W is loaded/unloaded on a spinner table of the cleaning section 20, and the position P4 is a position where the unprocessed wafer W is loaded and the processed (cleaned) wafer W is unloaded.

The cutting section 10 is constituted of two spindles 16A and 16B having blades 14A and 14B, respectively, imaging means 18 and 19 which perform fine alignment by imaging a pattern on the wafer W with a camera and recognizing the image of the pattern, and display means 12 which displays a picked up image and various kinds of information and comprising input means 11 represented by a touch screen. The spindles 16A and 16B of the cutting section 10 and the imaging means 18 and 19 can move along arrow A-B (Y axis direction) of FIG. 2. Further, since the cutting table having the wafer W thereon can move along arrow C-D (X axis direction) and can rotate (in θ direction), the surface of the wafer W is imaged and is subjected to image processing, and fine alignment can be carried out for cutting.

The wafer W having been subjected to the fine alignment is cut by the blades 14A and 14B rotated by the spindles 16A and 16B according to the movement of the cutting table. Then, the cutting is sequentially carried out so as to cut the wafer W in a lattice pattern.

The cleaning section 20 is provided for cleaning the cut wafer W. First, the spinner table having the wafer W thereon is moved down and the wafer W is cleaned with a spinner and clean water. After cleaning, the wafer W is dried with air and then the spinner table is moved up.

Moreover, the carrying device 50 is constituted of a slide arm which is movably attached to a rail guided in the Y axis direction, a swivel arm which is attached so as to freely pivot on the end of the slide arm, and a plurality of chucks which are attached to the ends of the swivel arm. The slide arm is moved forward/backward by a motor along the rail and the end of the slide arm is moved between the position P2 and the position P3. The swivel arm is caused to pivot on the end of the swivel arm by the motor and the end of the swivel arm is moved to the positions P1, P2, P3, and P4 according to the position of the slide arm. The chucks are each attached to the end of the swivel arm so as to freely rotate and has four claws for sandwiching the wafer W. The claws move in the diameter direction and vertical direction.

Figure 3:
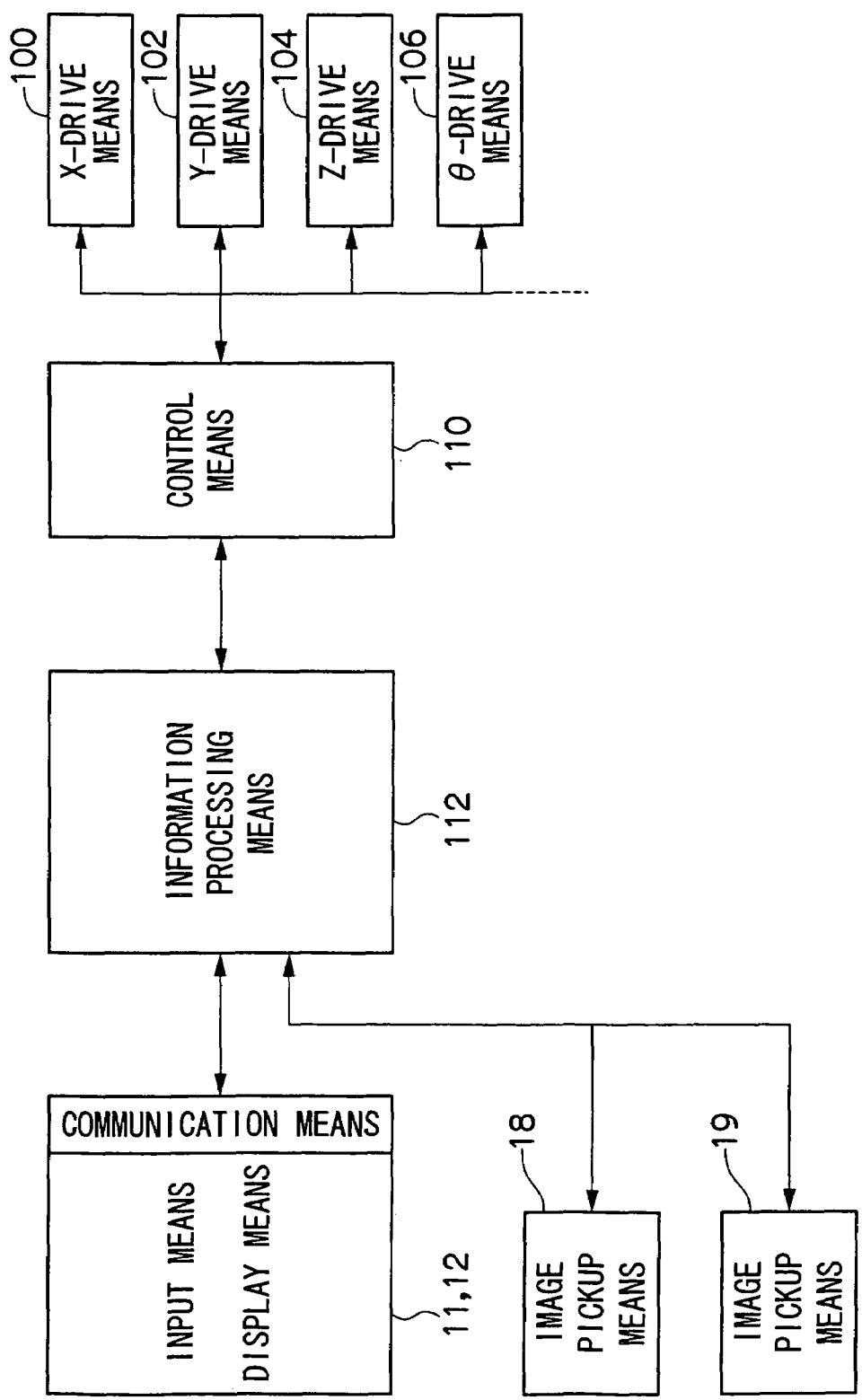
FIG. 3 is a block diagram showing an information processing section of the dicing device.

FIG. 3 shows a block diagram showing an information processing section of the dicing device.

As shown in FIG. 3, the information processing section of the dicing device comprises input means 11 allowing the operator to input commands for starting, stopping, and moving an observation position, display means 12 for enabling the dicing device to display a processing mode, a processing state, and an image of a wafer surface to the operator, and imaging means 18 and 19.

Further, the information processing section of the dicing device comprises drive means including X-drive means 100 for moving the cutting table having the wafer W thereon in the X axis direction, Y-drive means 102 for moving the spindles 16A and 16B of the cutting section 10 and the imaging means 18 and 19 in the Y axis direction, Z-drive means 104 for moving the spindles 16A and 16B and the imaging means 18 and 19 of the cutting section 10 in the Z axis direction, and θ-drive means 106 for rotating the cutting table having the wafer W thereon in the θ direction, and the information processing section comprises control moans 110 for outputting a driving command to each of the drive means and monitoring a driving position, a driving velocity, and error information when necessary, and information processing means 112 which transmits and receives information to and from the input means 11, the display means 12, the imaging means 18 and 19, and the control means 110 and controls the overall dicing device.

Moreover, the information processing means 112 has the function of conversion means which receives on-screen position information about a desired position inputted by the operator in an image of a wafer surface having been displayed by the display means 12, and converts the inputted position information to position information about the wafer surface, the function of moving means which moves a display position according to the converted position information about the wafer surface, and the function of moving means which moves the display position to the reference position of a wafer pattern. Besides, the information processing means 112 has the function of shape detecting means which detects reference information about a street pattern formed on a wafer surface, and comprises storage means such as a hard disk or a nonvolatile memory for storing the reference information.

Additionally, the information processing means 112 has the function of position calculating means which receives on-screen position information about a desired position inputted by the operator in an image of a wafer surface having been displayed by the display means 12 and calculates the position or the reference position of a street pattern closest to the inputted position information on the display, and the function of conversion means which converts information about the calculated position of the street pattern on the display into position information about the wafer surface according to the reference information about the street pattern, reference information being stored in the storage means.

Figure 4:
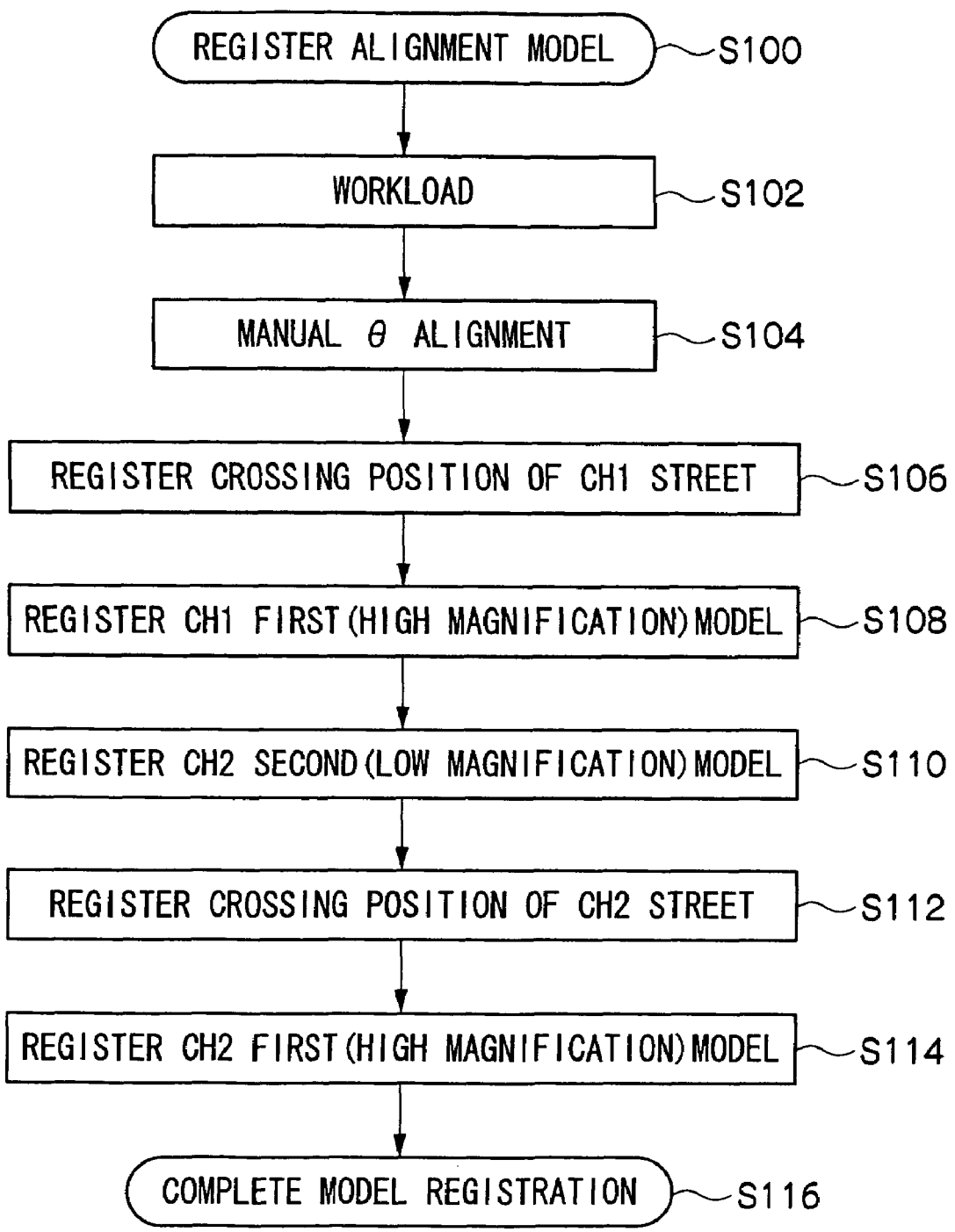
FIG. 4 is a flowchart showing steps for alignment model registration of a standard wafer W.

FIG. 4 is a flowchart showing the alignment model registration of a standard wafer W. The registration is made by the dicing device.

When it is necessary to register an alignment model of the wafer W in the cutting process performed by the dicing device on the wafer W, as shown in FIG. 4, the processing program of the information processing means 112 invokes step S100 "Register alignment model" (hereinafter abbreviated as S100) of a processing routine for the alignment model registration. Thereafter, the routine proceeds to the subsequent step S102 "Workload."

In S102, the two or more unprocessed wafers W having been stored in the cassette 30 are drawn in sequence by the elevator 40 and the wafers W are set on the position P4 of FIG. 2. Then, the wafers W are placed on a work table (not shown) (on the position P2) via a preloading stage on the position P1 by the carrying device 50 and the wafers W are sucked and held thereon.

A pattern on the surface of the wafer W, which has been carried to the work table and is sucked and held thereon, is imaged by the imaging means 18 or 19 having been automatically moved to the center of the work table, and the pattern is displayed on the display means 12 and is subjected to image recognition by the image processing means 112. The routine proceeds to the subsequent step S104 "Manual θ alignment."

In S104, the θ axis is aligned so that the street of the work is in parallel with the X axis. At this point, the rotation input of the θ axis is instructed according to the steps below.

The center of the imaging means 18 or 19 is aligned with a street edge and the like in the vicinity of the center of the work on CH1 side (first channel indicating an axis in parallel with the X axis) and registration is made in the internal memory of the information processing means 112 (the central position is determined). According to the present invention, in the method of designating a display position (method of "aligning") by aligning the center of the imaging means 18 or 19 with the street edge and the like in the vicinity of the center of the work, the operator only has to touch a position on the display means 12 with a finger to designate the position as described bellow.

Figure 5:
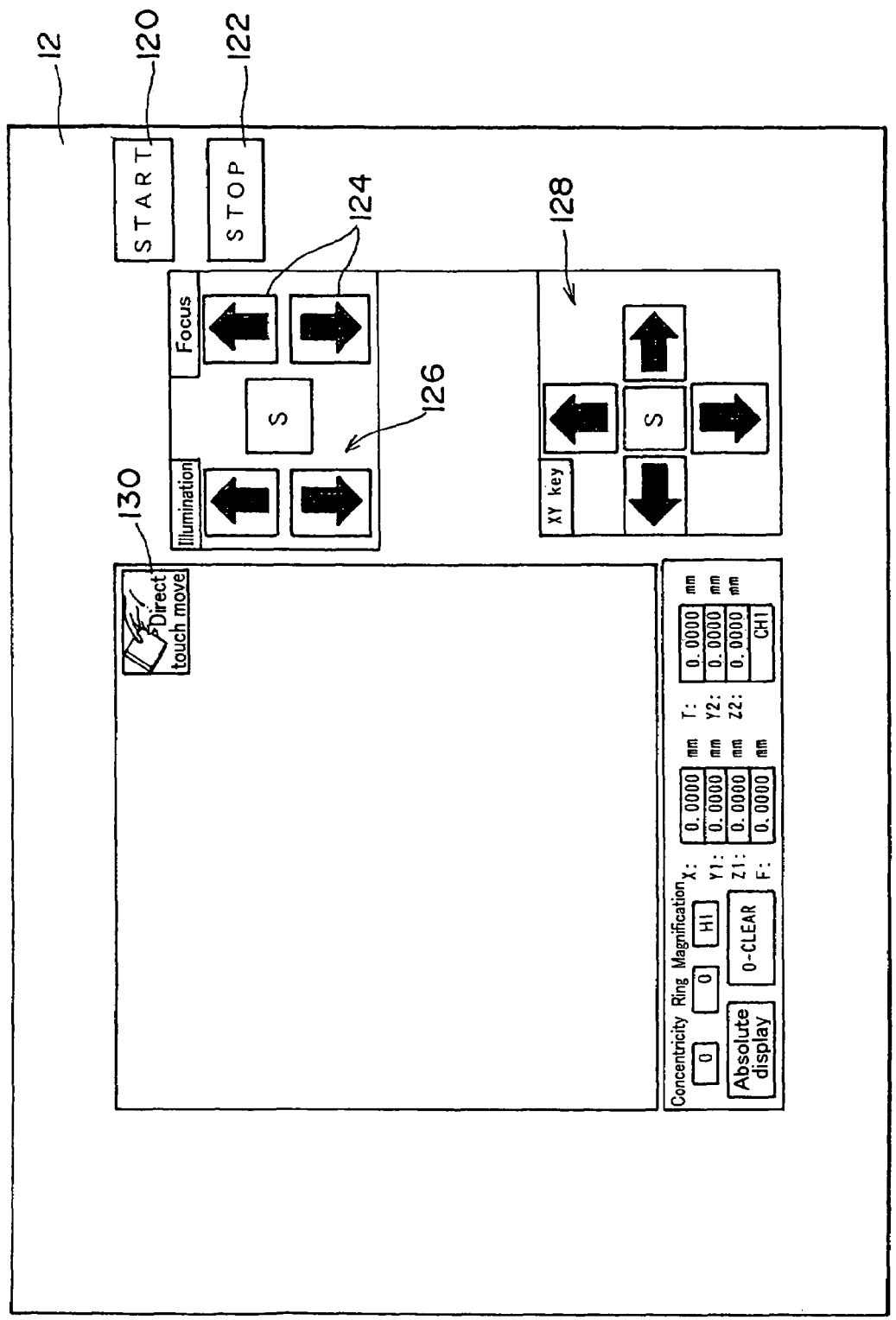
FIG. 5 is a diagram showing the contents of initial display provided on display means.
Figure 6:
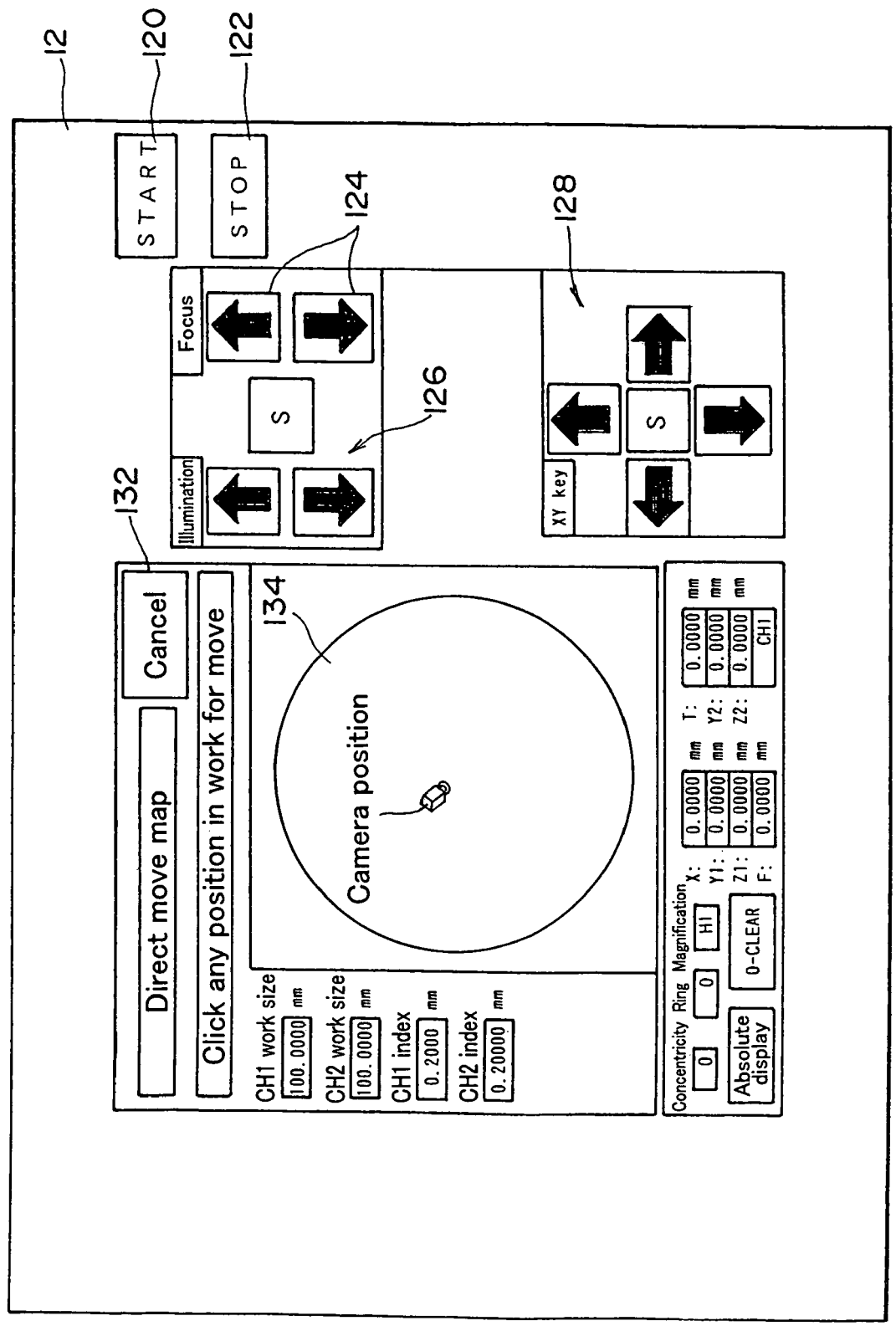
FIG. 6 is a diagram showing contents displayed in a direct touch mode.

FIG. 5 shows the contents of initial display on the display means 12. FIG. 6 shows contents displayed in a direct touch mode.

As shown in FIG. 5, the display means 12 comprises a start button 120 for input to start the operation of the dicing device, a stop button 122 for input to stop the operation, a focus adjusting button 124 for adjusting the focuses of the imaging means 18 and 19, an illumination adjusting button 126 for adjusting the luminance of illumination during imaging, an XY key 128 for inputting a moving vector when an imaging position is moved, and a direct touch moving button 130 for providing an instruction for switching to a mode in which a desired position (position on the display) on the displayed wafer W is designated with the touch of a finger.

FIG. 6 shows display for change when the direct touch moving button is pressed in the state of FIG. 5. As shown in FIG. 6, the display means 12 additionally displays a cancel button 132 for inputting an instruction to cancel the direct tough moving mode and a wafer map display 134 for indicating the overall shape of the wafer W. Instead of the wafer map display 134, an enlarged image obtained by imaging may be displayed.

Figure 7:
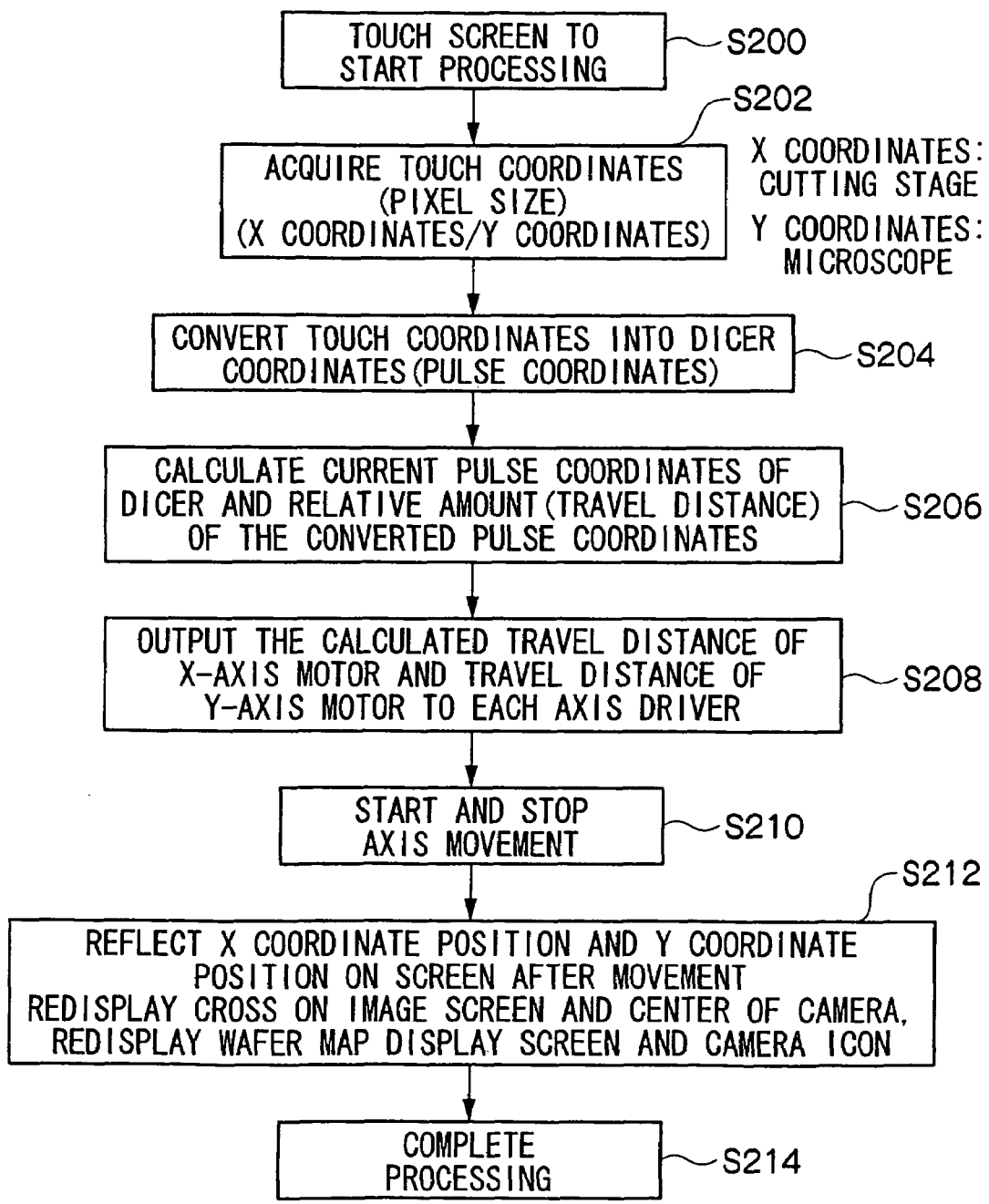
FIG. 7 is a flowchart showing a method of designating a display position on a touch screen.

FIG. 7 is a flowchart showing the method of designating a display position on the touch screen.

When the dicing device is set in the direct touch mode, the processing program of the dicing device invokes a processing routine shown in FIG. 7. The program is branched to step S200 "Touch screen to start processing."

When the operator touches a desired position for movement with a finger, the processing program proceeds to the subsequent step S202 "Acquire touch coordinates (pixel size) (X coordinates/Y coordinates)." In S202, inputted position information (position information about pixels on the screen or coordinate values and so on based on the resolving power of the touch screen) on the touch screen (input means 11) is sent to the information processing means 112 via communication means of the input means 11, so that the information processing means 112 acquires the touch coordinates.

In the subsequent step S204 "Convert touch coordinates into dicer coordinates (pulse coordinates)," the information processing means 112 of the dicing device converts the received position information into displayed position information about the surface of the wafer W (the information includes a unit of an actual length or a driving unit pulse number and the like used for the driving of the drive means). In this case, the position information on the display is automatically converted according to the size of the wafer (a size and shape of 5 inches, 8 inches, etc.) and thus the operator can input a desired position using the same operating method regardless of the size of the wafer.

In the subsequent step S206 "Calculate current pulse coordinates of dicer and a relative amount (travel distance) of converted pulse coordinates," the information processing means 112 converts the converted position information about the surface of the wafer W into, for example, a travel distance relative to the current image position on the X axis and the Y axis (length information or driving pulse number on each of the axes).

In the subsequent step S208 "Output calculated travel distance of X-axis motor and travel distance of Y-axis motor to each axis driver," the information processing means 112 outputs the information about the calculated travel distance to the control means 110.

In the subsequent step S210 "Start and stop axis movement," the control means 110 sets accelerating conditions, decelerating conditions, and driving velocity conditions based on the received information about the travel distance and drives each axis in a synchronous manner.

The control means 110 monitors the driving condition of each axis every moment and controls the driving velocity of each axis. When movement is made to the position designated by the information processing means 112, the control means 110 replies to the information processing means 112 that the movement is completed.

The on-screen position information inputted by the operator is generally different from information about an accurate street position (position of a predetermined pattern) because the position is inputted with a finger. In most cases, when a position on the surface of the wafer W is designated in the use of the dicing device, a street position is designated. In the present invention, even when an imprecise position is designated, a display position is moved to a reference position such as a street position obtained near the imprecise position by image processing.

The on-screen position information inputted by the operator is converted on the position closest to a street pattern detected by the pattern detecting function of the information processing means 112 or the position closest to one or more reference positions of a pattern formed on the wafer surface, the reference positions being stored in the storage means. An instruction to move to the position is outputted to the control means 110. Then, the display position is moved to a position having the closest street to the position inputted by the operator.

After movement is made to the designated position, the program of the information processing means proceeds to step S212 "Reflect X coordinate position and Y coordinate position on screen after movement, Redisplay cross on image screen and center of camera, Redisplay wafer map display screen and camera icon." When the driving of the drive means is completed, the display means 12 displays the wafer surface of the designated display position. When the wafer map display 134 is redisplayed, a camera icon indicating an imaging position is also redisplayed. Further, when an enlarged image having been picked up is displayed, a + mark is displayed at the imaging center of the imaging means. When a picked up image has a wide imaging range and a high resolving power, only image data having been picked up may be used to move the display position, instead of driving the drive means to move the display position.

When movement to the designated position and redisplay are completed, the processing program proceeds to step S214 "Complete processing" and returns to the initial processing routine.

In this way, when the center of the imaging means 18 or 19 is moved to a street edge and so on in the vicinity of the center of the work or "alignment" is performed using direct touch for moving a display position, the X axis automatically moves to the left (or right) end of the work. Then, by direct touch, alignment is made with the edge of the same street as the position designated at the center, and the left (right) position is determined. Thus, the rotation angle of the θ axis is calculated based on the coordinates of the center position and the left (right) position and the θ axis is rotated and moved according to the angle.

After the left (right) position is determined, the X axis automatically moves to the vicinity of a work edge on the opposite side. In a similar manner, the center of the imaging means 18 or 19 is aligned with the street edge by direct touch. After the right (left) position is determined, the rotation angle of the θ axis is automatically calculated, the θ axis is rotated and moved, and the X axis automatically moves to a position on the opposite side of the work. This processing is repeated until the X axis and the street are in parallel with each other. The θ coordinates at this point are recorded in the internal memory at the completion of scanning.

Thereafter, the θ axis automatically rotates by 90° and the program waits for input of manual θ alignment on CH2 side (second channel indicating an axis perpendicular to the X axis). Similarly the street and the X axis are aligned by direct touch and the operation of S104 is completed.

In the subsequent step S106 "Register crossing position of CH1 street," after θ alignment, switching is automatically made to a model registration mode and the imaging means is moved to the vicinity of the center of the work. The imaging means 18 or 19 is aligned with an intersection point (crossing position) of the CH streets by direct touch and registration is made.

In the subsequent step S108 "Register CH1 first (high magnification) model," after the crossing position is registered, switching is made to a model pattern input mode and a model frame is displayed on the screen. The position of the model frame is aligned with a proper position by direct touch and registration is made.

In the subsequent step S110 "Register CH2 second (low magnification) model," the imaging magnification of the imaging means 18 or 19 is automatically switched to a low magnification and the model is registered by direct touch as in the case of a high magnification model. After registration, the θ axis automatically rotates by 90° and the imaging means 18 or 19 moves to the vicinity of the center of the work.

In the subsequent step S112 "Register crossing position of CH2 street," the imaging magnification of the imaging means 18 or 19 is automatically switched to a high magnification and the intersection point of the street is registered as a crossing position by direct touch as in the case of CH1.

In the subsequent step S114 "Register CH2 first (high magnification) model," the screen is automatically switched to the model registration mode as in the case of CH1, and a CH2 high magnification model is registered by direct touch. The steps are similar to those of CH1.

After "Register CH2 first (high magnification) model" in step S114, the program proceeds to step S116 "Complete model registration" and the registration of the alignment model is completed.

When the alignment model of the wafer W is registered in the above manner, the following alignment is performed before cutting.

The street pattern of the wafer W, which is sucked and held on the work table, is imaged by the imaging means 18 and 19 and is displayed on the display means 12. Then, the pattern is subjected to image recognition by the information processing means 112. Pattern matching is performed based on the image information and a reference pattern having been registered in the storage means, a street is detected, and alignment for cutting is adjusted. Then, the wafer W having been subjected to alignment adjustment is moved in the Y axis direction, which is indicated by arrow A-B shown in FIG. 2, and is moved in the X axis direction, which is indicated by arrow C-D of the work table, so that two streets are cut at the same time. When the first two streets are cut, the spindles 16A and 16B of the cutting section 10 are moved by a pitch of the streets in the Y axis direction. Then, the work table is moved in the X axis direction again, so that the subsequent two streets are cut. The cutting operation is repeated to cut predetermined streets in one direction (X direction).

After the predetermined streets are cut, a cutting groove having been cut is imaged by the imaging means 18 or 19 and kerf check is automatically performed on the cutting groove. In the kerf check, cutting results are inspected which include a degree of chipping (chip) on the wall of the cutting groove and a displacement of the cutting groove from the street. In the event of a large chip or a large displacement of the cutting groove from the street, an operator call is made to notify the operator of a malfunction. Moreover, when the cutting groove is slightly displaced from the original cutting groove, the cutting position is automatically corrected. When a small chip is observed, correction such as a change in the cutting condition is performed and a predetermined number of times of cutting is continued thereafter. Also in the case of manual kerf check, kerf check can be swiftly conducted by using direct touch as means for moving a display position to a desired observation position.

When all the streets are cut in one direction (X direction), the work table rotates by 90° and streets intersecting the cut streets are cut in sequence. Thus, the wafer W is cut finally in a lattice pattern.

After the cutting, the wafer W is returned to the position P2 by the work table and then is carried to the spinner table of the cleaning section 2 on the position P3 by the carrying device 50. After cleaning with clean water, the wafer W is dried with air. The cleaned and dried wafer W is carried to the position P4 by the carrying device 50 and then is stored in the cassette 30 by the elevator 40.

In the above-described embodiment, the touch screen is used as means for inputting position information by designating an arbitrary position displayed by the display means, by using a position on the display. The present invention is not particularly limited and thus a pointing device such as a mouse, a track ball, and a tablet may be used as input means.

Industrial Applicability

As described above, according to the wafer observation position designating apparatus and the wafer display position designating method of the present invention, when a wafer surface is observed, quick movement is made to a desired display position.

The invention claimed is:

1. A dicing apparatus, characterized in that the apparatus comprises:
    image pickup means for picking up image of the surface of the wafer,
    display means for displaying an image picked up by the imaging means,
    input means using a pointing device for inputting position information by designating an arbitrary position displayed by the display means, by using a position on a display,
    shape detecting means for detecting reference information of a straight street pattern shape which is formed on the wafer surface according to the image picked up by the imaging means,
    storage means for storing the reference information of the straight street pattern shape detected by the shape detecting means and one or a plurality of reference position(s) of the straight street pattern shape formed on the wafer surface,
    conversion means for converting the inputted position information into a position closest from the inputted position information out of the straight street pattern shape detected by the shape detecting means, or the position closest to the input position information out of the one or a plurality of reference position(s) of the straight street pattern shape formed on the wafer surface, according to the reference information, and
    moving means for moving a display position into the converted position in response to the inputted position information, wherein
    after the straight street pattern shape closest to the position designated by the input means is matched to the center position of an image picked up by the imaging means, manual alignment is performed with manual operation to adjust the straight street pattern shape formed on the wafer surface and the movement direction during processing to be parallel, by moving the wafer to a position where the wafer edge is picked up by the imaging means in an axial moving direction at processing; and at the moved position, the edge position of the straight street pattern shape closest to the position designated by the input means which has been matched to the center position of the image is determined, and the wafer is rotationally moved according to the rotation angle calculated by the center position and the edge position.

2. The dicing apparatus according to claim 1, characterized in that when the inputted position information indicates a position not having the wafer, the conversion means converts the inputted position information into wafer position information closest to the inputted position.

3. A dicing apparatus, comprising:
an image pickup device for picking up image of the surface of the wafer,
a display device for displaying an image picked up by the imaging device,
an input device using a pointing device for inputting position information by designating an arbitrary position displayed by the display device, by using a position on a display,
a shape detecting device for detecting reference information of a straight street pattern shape which is formed on the wafer surface according to the image picked up by the image device,
a storage device for storing the reference information of the straight street pattern shape detected by the shape detecting device and one or a plurality of reference position(s) of the straight street pattern shape formed on the wafer surface,
a conversion device for converting the input position information into a position closest from the input position information out of the straight street pattern shape detected by the shape detecting means, or the position closest to the input position information out of the one or a plurality of reference position(s) of the straight street pattern shape formed on the wafer surface, according to the reference information, and
a moving device for moving a display position into the converted position in response to the input position information, wherein
after the straight street pattern shape closest to the position designated by the input device is matched to the center position of an image picked up by the image device, manual alignment is performed with manual operation to adjust the straight street pattern shape formed on the wafer surface and the movement direction during processing to be parallel, by moving the wafer to a position where the wafer edge is picked up by the image device in an axial moving direction at processing; and at the moved position, the edge position of the straight street pattern shape closest to the position designated by the input device which has been matched to the center position of the image is determined, and the wafer is rotationally moved according to the rotation angle calculated by the center position and the edge position.

4. The dicing apparatus according to claim 3, wherein when the input position information indicates a position not having the wafer, the conversion device converts the input position information into wafer position information closest to the input position.

* * * * *